US012812808B2

(12) United States Patent
Ribeiro et al.

(10) Patent No.: US 12,812,808 B2
(45) Date of Patent: Nov. 24, 2026

(54) OUTDOOR-MOUNTABLE ELECTRONIC APPARATUS CONFIGURED FOR MOISTURE INTRUSION MITIGATION

(71) Applicant: UBICQUIA, INC., Fort Lauderdale, FL (US)

(72) Inventors: Claudio Santiago Ribeiro, Evanston, IL (US); Cesar Eduardo Nunez, Miramar, FL (US); Elliott Earl Murray, Plantation, FL (US); Steven Kenneth Mackiewicz, Shorewood, IL (US)

( * ) Notice: Subject to any disclaimer, the term of this patent is extended or adjusted under 35 U.S.C. 154(b) by 183 days.

(21) Appl. No.: 18/218,094

(22) Filed: Jul. 4, 2023

(65) Prior Publication Data

US 2023/0354539 A1 Nov. 2, 2023

Related U.S. Application Data

(63) Continuation-in-part of application No. 29/801,812, filed on Jul. 30, 2021, now Pat. No. Des. 991,895.

(60) Provisional application No. 63/423,801, filed on Nov. 8, 2022.

(51) Int. Cl.
*H05K 5/06* (2006.01)
*H05K 5/02* (2006.01)
*H04W 88/08* (2009.01)

(52) U.S. Cl.
CPC ........... *H05K 5/061* (2013.01); *H05K 5/0226* (2013.01); *H05K 5/0247* (2013.01); *H04W 88/08* (2013.01)

(58) Field of Classification Search
CPC ..... H05K 5/061; H05K 5/0226; H05K 5/0247
See application file for complete search history.

(56) References Cited

U.S. PATENT DOCUMENTS 4,102,466 A * 7/1978 Jadatz .................... H02G 3/088 174/67
4,319,313 A * 3/1982 Eberhart ............... F21V 29/507 362/370
4,320,443 A * 3/1982 Zwillich ............... F21V 29/507 362/370
4,381,063 A * 4/1983 Leong ...................... H02G 3/14 174/67
5,045,640 A * 9/1991 Riceman ............. H01R 13/447 174/67

(Continued)

*Primary Examiner* — Rockshana D Chowdhury
*Assistant Examiner* — Douglas R Burtner
(74) *Attorney, Agent, or Firm* — Daniel C. Crilly

(57) ABSTRACT

An outdoor-mountable electronic apparatus includes a housing, one or more electrical connectors, and an angled access door. The housing includes a top portion, a bottom portion, and one or more side portions interconnecting the top and bottom portions. The housing's bottom portion includes an extended end section at one end of the housing. The extended end section is directed (e.g., curved, tapered, or angled) upward. The housing's side portion(s) and the extended end section of the housing's bottom portion define a cavity. The electrical connectors are mounted within the cavity. The access door may be hinged or pivotally coupled to the housing's top portion and is configured to cover the housing's cavity when the access door is closed. A seal may also be included along the perimeter edges of the housing side portion(s) and bottom portion's extended end section to further mitigate moisture intrusion when the access door is closed.

20 Claims, 4 Drawing Sheets

(56) References Cited

U.S. PATENT DOCUMENTS

| | | | | | |
|---|---|---|---|---|---|
| 5,218,169 | A * | 6/1993 | Riceman | H01R 13/447 | 174/67 |
| 5,533,637 | A * | 7/1996 | Williams, Jr. | H02G 3/14 | 220/3.9 |
| 5,588,182 | A * | 12/1996 | Brownlie | H02G 15/117 | 16/268 |
| 6,009,717 | A * | 1/2000 | Hernandez | F24F 1/027 | 62/262 |
| 6,132,065 | A * | 10/2000 | Wedell | F21V 23/04 | 362/267 |
| 6,525,890 | B1 * | 2/2003 | Wang | F21V 17/18 | 359/896 |
| 7,476,806 | B2 * | 1/2009 | Dinh | H02G 3/086 | 174/58 |
| 7,619,162 | B2 * | 11/2009 | Dinh | H01R 13/447 | 174/53 |
| 7,866,854 | B2 * | 1/2011 | Orellana | F21V 29/763 | 362/186 |
| 7,947,901 | B2 * | 5/2011 | Leopold | H02G 3/088 | 174/67 |
| 7,999,419 | B2 * | 8/2011 | Drane | H01H 3/161 | 307/326 |
| 8,031,472 | B2 * | 10/2011 | Bicket | H05K 5/0247 | 345/157 |
| 8,254,089 | B2 * | 8/2012 | Cosley | H02B 1/32 | 361/640 |
| 8,305,738 | B1 * | 11/2012 | Czarnecki | H02G 3/086 | 174/50 |
| 8,310,818 | B1 * | 11/2012 | Czarnecki | H02B 1/50 | 361/647 |
| 8,514,551 | B2 * | 8/2013 | Cosley | H02B 1/32 | 361/635 |
| 8,530,757 | B2 * | 9/2013 | Dinh | H02G 3/185 | 174/559 |
| 8,559,167 | B1 * | 10/2013 | Czarnecki | H02B 1/46 | 361/647 |
| 8,885,328 | B1 * | 11/2014 | Czarnecki | H02B 1/42 | 361/652 |
| 9,255,705 | B2 * | 2/2016 | Wilcox | F21V 29/83 | |
| 9,261,251 | B1 * | 2/2016 | Ladewig | F21V 31/03 | |
| 9,385,514 | B2 * | 7/2016 | Dively | H02G 3/0493 | |
| 9,560,784 | B1 * | 1/2017 | Elbaz | H05K 5/03 | |
| 9,642,186 | B1 * | 5/2017 | Dureja | H04W 88/10 | |
| 11,121,533 | B2 * | 9/2021 | Baldwin | H02G 3/081 | |
| D933,627 | S * | 10/2021 | Ribeiro | D14/242 | |
| 11,401,743 | B2 * | 8/2022 | Coons | E05C 19/14 | |
| D991,895 | S * | 7/2023 | Ribeiro | D14/240 | |
| 11,897,567 | B2 * | 2/2024 | Wattrus | F16M 11/041 | |
| 12,003,016 | B2 * | 6/2024 | Colapietro | H01Q 1/243 | |
| 12,015,194 | B2 * | 6/2024 | Hendrix | H01Q 1/02 | |
| 2004/0198453 | A1 * | 10/2004 | Cutrer | H04W 88/08 | 455/562.1 |
| 2006/0132006 | A1 * | 6/2006 | Schluter | H05K 5/0226 | 312/323 |
| 2009/0312058 | A9 * | 12/2009 | Wood | H04M 1/605 | 455/575.8 |
| 2012/0262917 | A1 * | 10/2012 | Courcelle | F21V 15/01 | 362/249.05 |
| 2017/0301220 | A1 * | 10/2017 | Jarrell | G08B 25/10 | |
| 2018/0045388 | A1 * | 2/2018 | McDowell | H02G 1/00 | |
| 2018/0254545 | A1 * | 9/2018 | Hendrix | H01Q 1/44 | |
| 2020/0323036 | A1 * | 10/2020 | Ross | H04W 88/10 | |

* cited by examiner

OUTDOOR-MOUNTABLE ELECTRONIC APPARATUS CONFIGURED FOR MOISTURE INTRUSION MITIGATION

CROSS-REFERENCE TO RELATED APPLICATIONS

The present application is a continuation-in-part of U.S. Design application No. 29/801,812, now Design Pat. No. D991,895, which was filed on Jul. 30, 2021, and is incorporated herein by this reference in its entirety. The present application also claims the benefit of, and priority upon, U.S. Provisional Application No. 63/423,801, which was filed on Nov. 8, 2022, and is incorporated herein by this reference in its entirety.

TECHNICAL FIELD

The present disclosure generally relates to outdoor-mountable electronic apparatus requiring connections with exposed cables. More particularly, but not exclusively, the present disclosure relates to an outdoor-mountable electronic apparatus configured to mitigate intrusion of moisture present on exposed cables connected to the electronic apparatus.

BACKGROUND

As is known, many different types of electronic devices, such as small cells and wireless access points, are mounted in outdoor environments subject to structural or environmental constraints. Such electronic devices typically include an open end in the form of a vertical interface wall that enables access to electronic connectors connected to the wall. Unfortunately, the electronic device's interface wall is susceptible to water or moisture intrusion. Even when the interface wall includes a cover, water or moisture intrusion may still occur, particularly when environmentally exposed wires or cables are used to connect to the electronic connectors at the interface wall.

Existing configurations for covering the interface wall of an outdoor-mountable electronic device fail to provide easy access to the cable or wire connectors that mate to or with the connectors on the interface wall. Lack of ease of installation or repair adds cost and time to deployment or repair costs when technicians need to visit the outdoor-mounted electronic device in the field.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

SUMMARY

According to one exemplary embodiment of the present disclosure, an outdoor-mountable electronic apparatus includes a housing, one or more electrical connectors, and an angled access door. The housing includes a top portion, a bottom portion, and one or more side portions interconnecting the top portion and the bottom portion. The bottom portion of the housing includes an extended end section at one end of the housing. The extended end section of the housing's bottom portion is directed (e.g., curved, tapered, angled, or otherwise oriented) upward, such as toward a plane in which a flat section of the top portion of the housing lies. The one or more side portions of the housing and the extended end section of the bottom portion of the housing define a cavity in which the one or more electrical connectors are mounted. The access door is coupled to the top portion of the housing and is sized and shaped to completely cover the cavity when the access door is in a closed position. In some embodiments, the electronic apparatus may be further configured to downwardly bias wiring or cabling coupled to the electrical connectors.

In some embodiments of the present disclosure, the access door may be hinged where it connects to the top portion of the housing. Alternatively, the access door may be pivotally coupled to the top portion of the housing.

In further embodiments of the present disclosure, the electronic apparatus may also include a seal, such as a gasket, installed along perimeter edges of the one or more side portions and along the extended end section of the bottom portion of the housing to provide a moisture seal or otherwise mitigate moisture intrusion when the access door is closed.

In alternative embodiments of the present disclosure, the extended end section of the bottom portion of the housing may define at least one cable access port for passage of at least one connector cable. In such a case, the electronic apparatus may also include at least one removable plug for covering the at least one cable access port when such port(s) is not being used. Additionally or alternatively, the electronic apparatus may further include a gasket positioned within each cable access port to mitigate intrusion of moisture through the cable access port after a connector cable has been passed through the cable access port and connected to one of the electrical connectors.

In other embodiments of the present disclosure, the access door includes a spring-loaded hinge for biasing the access door toward the extended end section of the bottom portion of the housing when the access door is in the closed position.

In still other embodiments of the present disclosure, the access door may define at least one aperture and the extended end section of the bottom portion of the housing may define at least one corresponding threaded aperture. In such a case, a fastener, such as a screw, may be used to secure the access door to the extended end section of the bottom portion of the housing through the apertures.

In further embodiments of the present disclosure, the electronic apparatus may include a wall interconnecting the top portion and the bottom portion of the housing proximate the extended end section of the bottom portion of the housing. In such a case, the electrical connectors may be mounted to the wall, with the wall further defining the cavity.

In still other embodiments of the present disclosure, the electronic apparatus may include a powerline connector mounted through an aperture defined by the bottom portion of the housing. In such a case, the powerline connector may be configured to receive electrical power from an external power source, such as a complementary powerline connector mounted atop a streetlight fixture. When the electronic apparatus is intended for streetlight mounting, the apparatus' housing may be configured for horizontal mounting to the streetlight fixture's powerline connector. For example, the housing may be configured as a low profile or aerodynamic housing to be able to withstand various wind loads without becoming separated from the streetlight fixture.

In still other embodiments of the present disclosure, the electronic apparatus may be streetlight-mountable and be a wireless networking device, such as wireless access point, a small cell or base station device, a repeater, a networked lighting controller, a networked public safety and image processing platform, or any other electronic apparatus. Depending on the intended function of the electronic apparatus, the electrical connectors may include camera video and power connectors, Ethernet connectors, universal serial bus (USB) connectors, fiber optic connectors, or any other connectors to enable various accessories to connect to the electronic apparatus.

In one or more alternative embodiments of the present disclosure, a streetlight-mountable electronic apparatus includes a housing, one or more electrical connectors, a powerline connector, and a hinged, angled access door. In this embodiment, the housing includes a top portion, a bottom portion, and one or more side portions interconnecting the top portion and the bottom portion. The bottom portion of the housing includes an extended end section at one end of the housing. The extended end section of the housing's bottom portion is directed (e.g., curved, tapered, angled, or otherwise oriented) upward, such as toward a plane in which a flat section of the top portion of the housing lies. The one or more side portions of the housing and the extended end section of the bottom portion of the housing define a cavity in which the one or more electrical connectors are mounted. The access door is coupled to the top portion of the housing and is sized and shaped to completely cover the cavity when the access door is in a closed position. The powerline connector is mounted through an aperture defined by the bottom portion of the housing and is configured to receive electrical power from a streetlight lighting fixture.

In one or more alternative embodiments of the present disclosure, a streetlight-mountable wireless networking device includes a low-profile housing and a hinged, angled access door. According to this embodiment, the housing includes a top portion, a bottom portion, and one or more side portions interconnecting the top portion and the bottom portion. The bottom portion of the housing includes an extended end section at one end of the housing. The extended end section of the housing's bottom portion is curved upward (such as toward a plane in which a flat section of the top portion of the housing lies) and defines at least one cable access port therein. The access door is sized and shaped to rest against perimeter edges of the one or more side portions of the housing and a perimeter edge of the extended end section of the bottom portion of the housing when the access door is in a closed position.

In further embodiments of the present disclosure, a method for servicing an outdoor-mountable electronic apparatus configured for moisture intrusion mitigation may be performed. According to one exemplary embodiment of such method, an installation or repair technician threads each of one or more wires or cables through a respective cable access port defined in an upwardly curved end section of a bottom portion of the electronic apparatus' housing. If an access port is covered by a removable plug, the plug is removed before commencing the cable or wire threading. During or after threading the wire(s) or cable(s) through the cable access port(s), an angled access door is opened, such as by raising or lifting it. The access door covers a cavity formed by one or more side portions of the electronic apparatus' housing and the upwardly curved end section of the bottom portion of the electronic apparatus' housing. After opening the access door, a connector terminating each of the previously threaded wires or cables is coupled or connected to a respective electrical connector located within the cavity. After completing the cable connections, the access door is closed and optionally secured to the upwardly curved end section of the bottom portion of the electronic apparatus' housing, such as through use of one or more fasteners.

BRIEF DESCRIPTION OF THE DRAWINGS

Non-limiting and non-exhaustive embodiments are described with reference to the following drawings, wherein like reference numerals refer to like elements throughout the various views, unless otherwise specified. The sizes and relative positions of elements in the drawings are not necessarily drawn to scale. For example, the shapes of various elements as shown in the drawings are merely exemplary and have been selected, enlarged, and positioned to improve drawing legibility.

DETAILED DESCRIPTION

In the following description, certain specific details are set forth to provide a thorough understanding of various disclosed embodiments. However, one skilled in the relevant art will recognize that embodiments may be practiced without one or more of these specific details, or with other methods, components, materials, etc. Also, known structures have been omitted or shown and described in reduced detail to avoid unnecessarily obscuring the present disclosure.

Referring to FIGS. 1-6, various views are shown of an exemplary outdoor-mountable electronic apparatus 100 configured for moisture intrusion mitigation, in accordance with embodiments of the present disclosure. In some embodiments, the electronic apparatus 100 may be mountable on or to streetlights, streetlight or utility poles, or other support structures and, when so mounted, exposed to outdoor environmental conditions, such as rain, snow, sleet, and other forms of moisture. In such an embodiment, the electronic apparatus 100 may be a wireless networking device, such as a wireless access point, a small cell or base station device, a repeater, a networked lighting controller, a networked public safety and image processing platform, or any other streetlight-mountable electronic apparatus.

Figure 1:
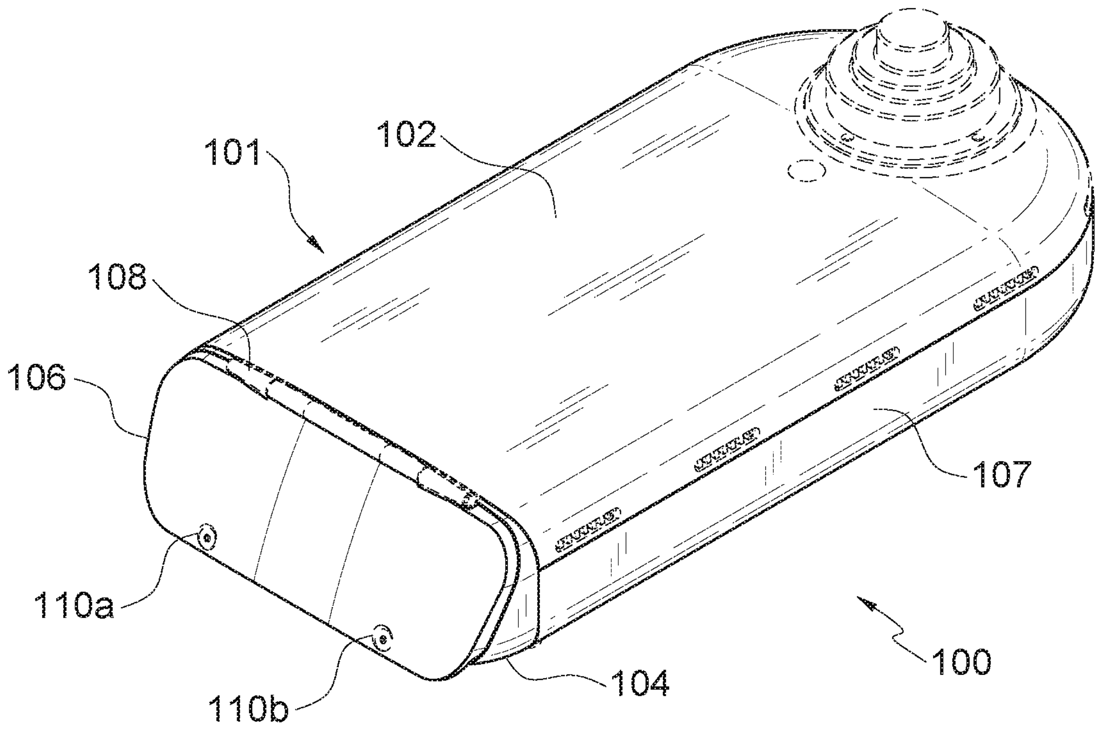
FIG. 1 illustrates a perspective view of an exemplary outdoor-mountable electronic apparatus with a housing configured for moisture intrusion mitigation, in accordance with some exemplary embodiments of the present disclosure.
Figure 2:
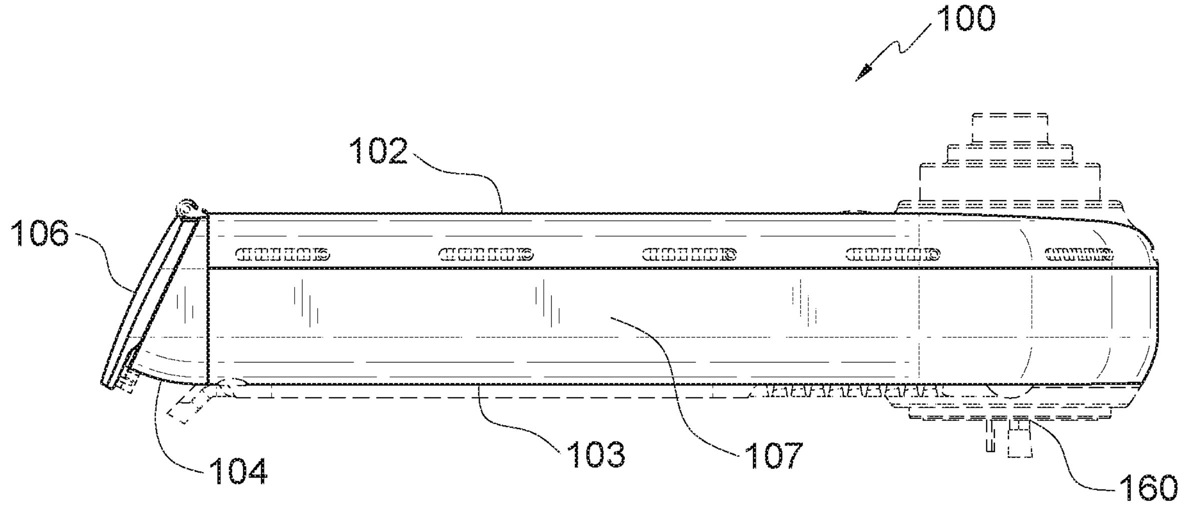
FIG. 2 illustrates a side view of the electronic apparatus of FIG. 1.
Figure 3:
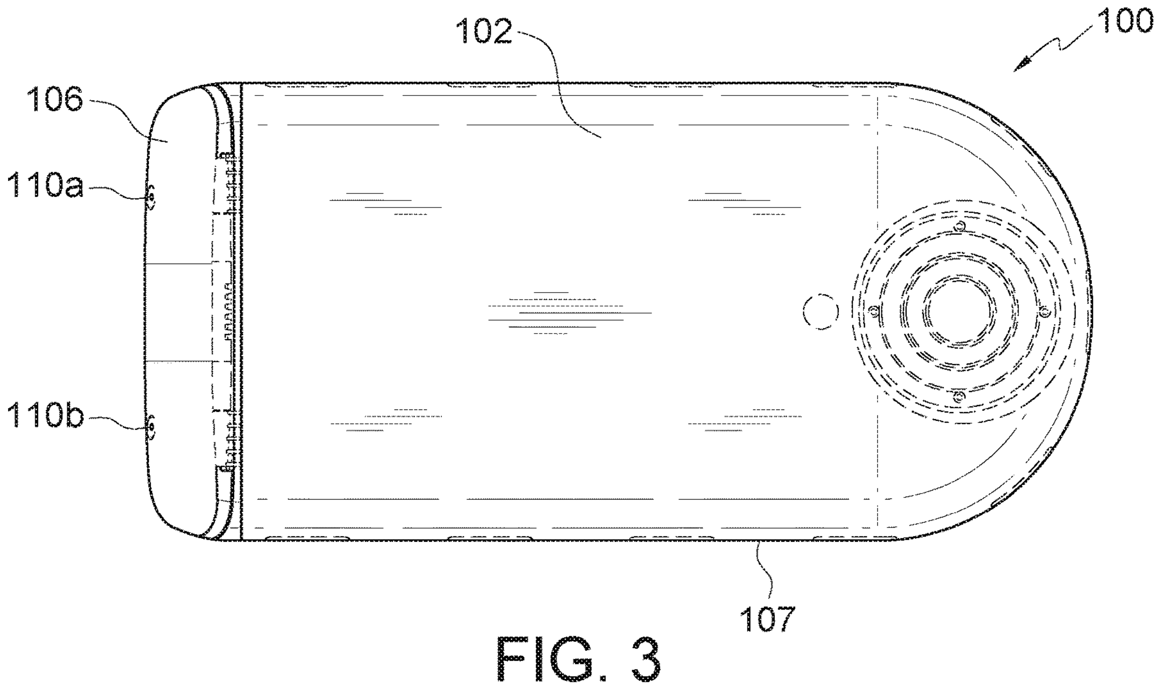
FIG. 3 illustrates a top view of the electronic apparatus of FIG. 1.
Figure 4:
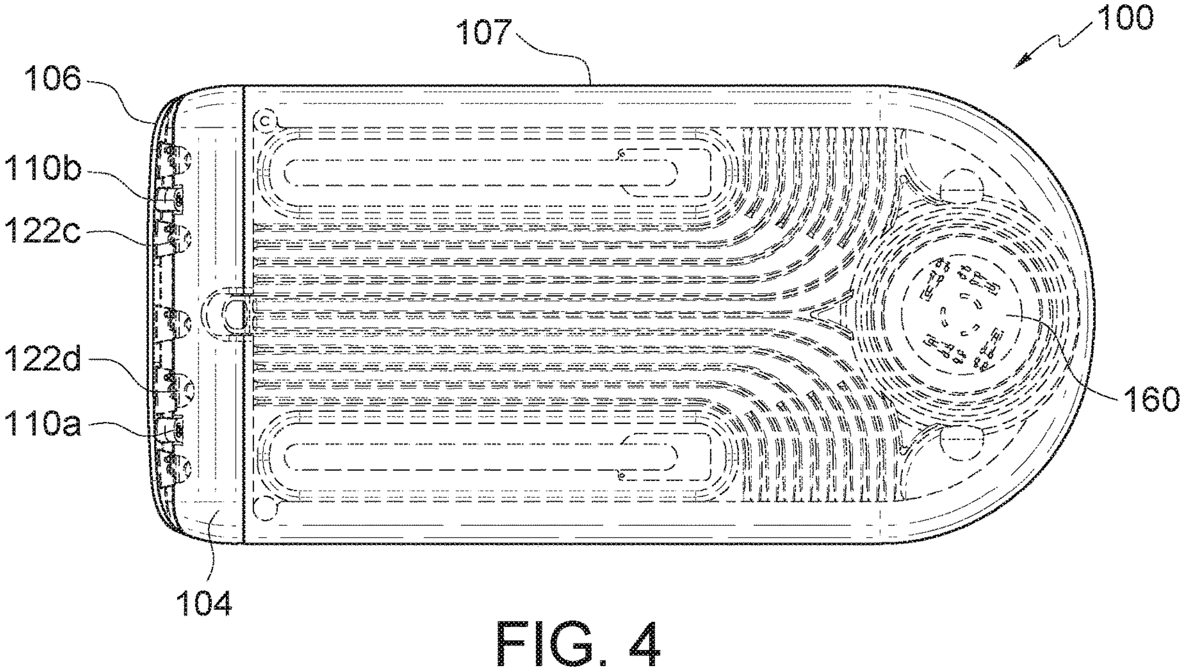
FIG. 4 illustrates a bottom view of the electronic apparatus of FIG. 1.

In some embodiments and with further reference to FIGS. 1-6, the outdoor-mountable electronic apparatus 100 includes a housing 101, one or more electrical connectors 126*a*-126*e* (five shown for illustration purposes), and an angled access door 106. The housing 101 includes a top portion 102, a bottom portion 103, and one or more side portions 107 interconnecting the top portion 102 and the bottom portion 103. The bottom portion 103 of the housing 101 includes an extended end section 104 that is directed (e.g., curved, tapered, angled, or otherwise oriented) upward, such as toward a plane in which a flat, planar section of the top portion 102 of the housing 101 lies. The side portions 107 of the housing 101 also include extended end sections that interconnect the extended end section 104 of the bottom portion 103 of the housing 101 to the top portion 102 of the housing 101 at a lengthwise end of the housing 101, as shown in FIGS. 1-3 and 6. Perimeter edges of the extended end sections of the side portions 107 are angled, as shown in FIGS. 1 and 2, to account for the differing lengths of the top portion 102 and the bottom portion 103 with its extended end section 104. The extended end sections of the side portions 107 of the housing 101 together with the extended end section 104 of the bottom portion 103 of the housing 101 define a cavity 140 or chamber in which the electrical connectors 126*a*-126*e* are mounted. For example, the housing cavity 140 may further include a wall 125 to which electrical connectors 126*a*-126*e* are mounted. When in a closed position, the access door 106 rests against at least the angled perimeter edges of the extended end sections of the side portions 107 of the housing 101, as shown in FIGS. 1 and 2.

The access door 106 is coupled to the top portion 102 of the housing 101 and is sized and shaped to fully cover the housing cavity 140 when the access door 106 is in a closed position. According to one exemplary embodiment, the access door 106 is sized and shaped to extend past the perimeter edge of the upwardly-directed, extended end section 104 of the bottom portion 103 of the housing 101. Such a configuration of the access door 106 reduces the likelihood that moisture forming or present on the outside of the access door 106 will flow toward the electrical connectors 126*a*-126*e* in the housing cavity 140 when such moisture flows onto cables 127 or wires coupled to electrical connectors intended to mate with the housing cavity's electrical connectors 126*a*-126*e*. In some embodiments, the electronic apparatus 100 and/or the access door 106 may be configured to downwardly bias any wires or cables 127 of mating connectors coupled to the housing cavity's electrical connectors 126*a*-126*e*.

According to another exemplary embodiment, the access door 106 is coupled to the top portion 102 of the housing 101 by a hinge. According to another exemplary embodiment, the access door 106 may be pivotally coupled to the top portion 102 of the housing 101. In some exemplary embodiments, a seal 120 may be installed along the perimeter edges of the housing's side portions 107 and along part or all of the perimeter edge of the extended end section 104 of the housing's bottom portion 103 to provide a moisture seal when the access door 106 is closed.

In other exemplary embodiments, the upwardly-directed, extended end section 104 of the housing's bottom portion 103 defines at least one cable access port 122*a*-122*e* for accommodating the passage of cables 127 and electrical connectors that mate with the cavity wall's electrical connectors 126*a*-126*e*.

In alternative embodiments, the electronic apparatus 100 may further include one or more removable plugs 129 for covering the cable access ports 122*a*-122*e* until they are used. In the exemplary embodiment shown in FIG. 6, an auxiliary camera 128 includes a cable 127 that is threaded through cable access port 122*b* to enable the electrical connectors of the wires contained within the camera cable 127 to be connected to mating connectors 126*a*, 126*b* mounted to the cavity wall 125.

In yet other embodiments, a gasket 112 may be inserted within each cable access port 122*a*-122*e* to further mitigate the intrusion of moisture after a cable 127 has been inserted or threaded through the associated cable access port 122*a*-122*e*.

Figure 6:
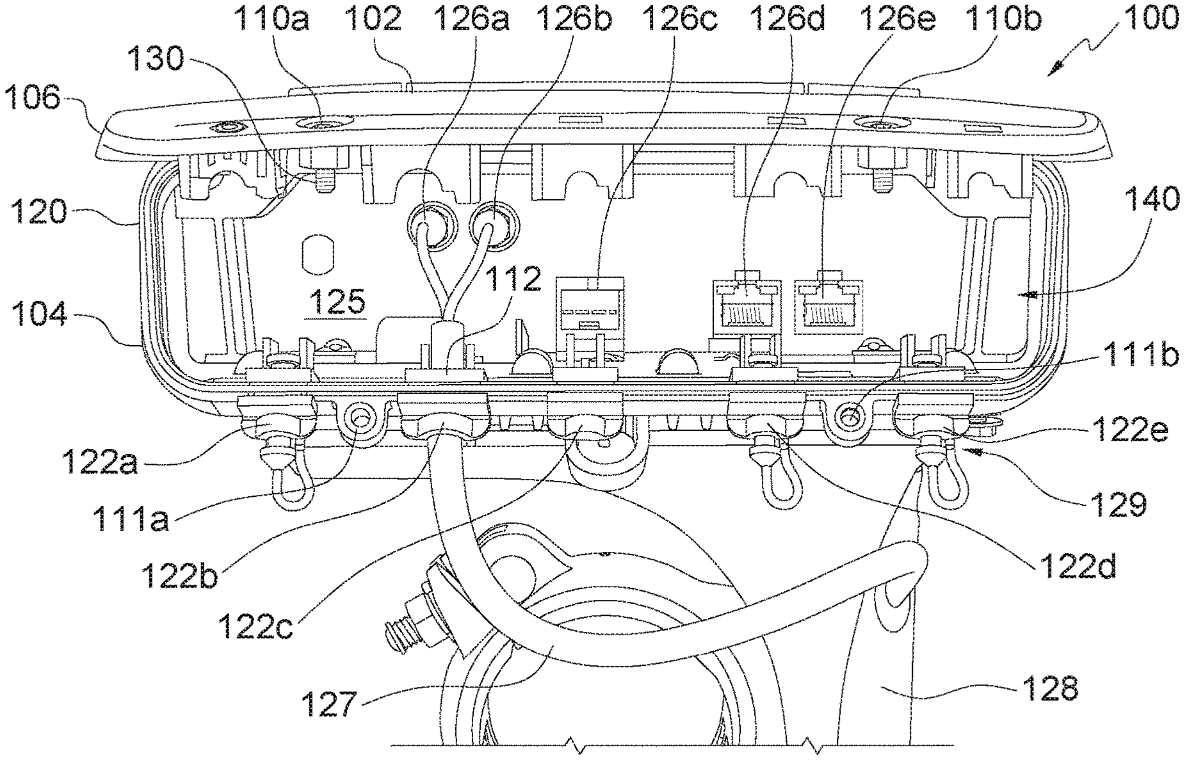
FIG. 6 illustrates a rear side view of the electronic apparatus of FIG. 1 illustrating an angled access door coupled to a top portion of the housing and in an open position.
Figure 7:
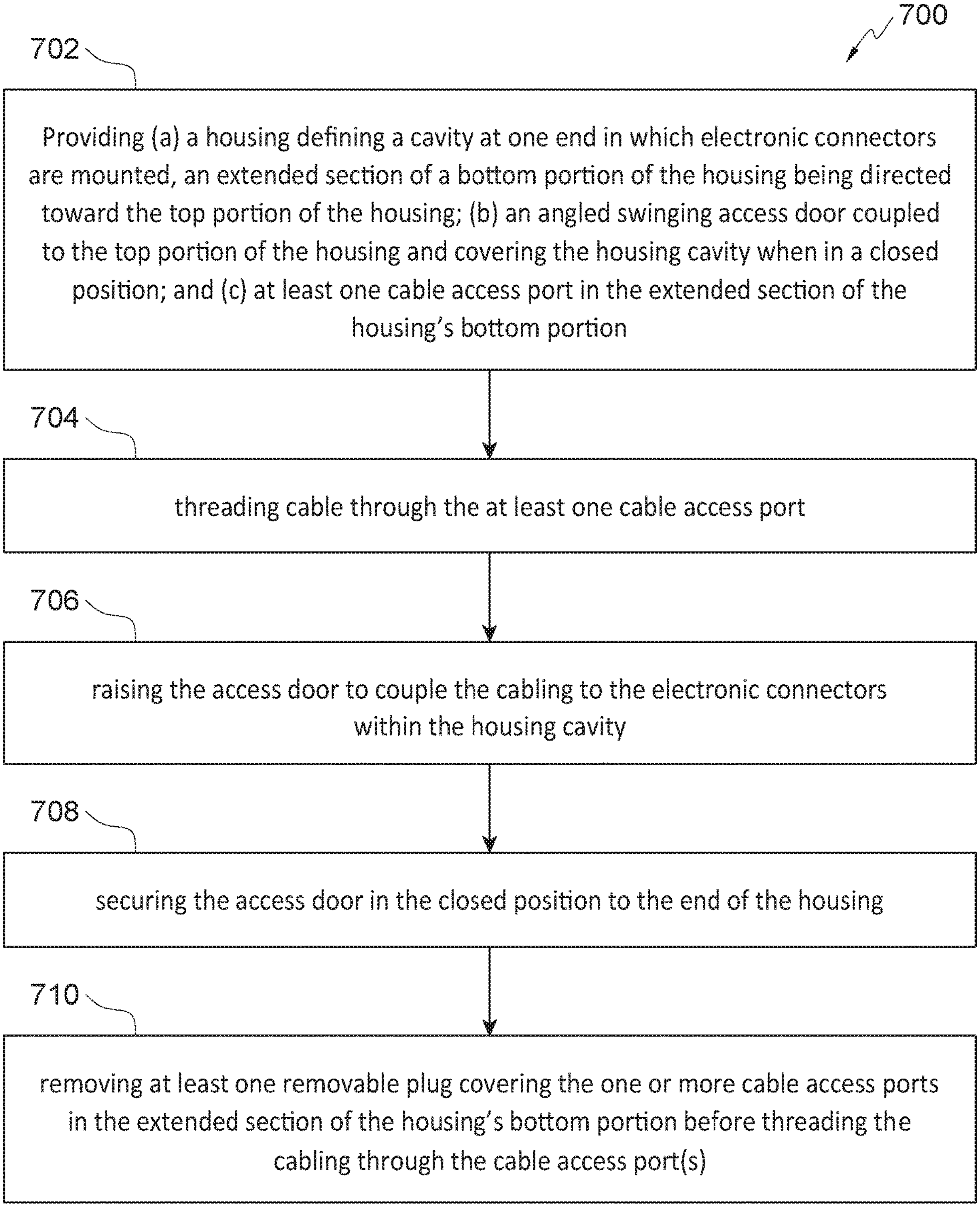
FIG. 7 illustrates a flow chart of an exemplary method for servicing an outdoor-mountable electronic apparatus with a housing configured for moisture intrusion mitigation, in accordance with some exemplary embodiments of the present disclosure.

In further alternative embodiments, the access door 106 includes a hinge 108 to enable the access door 106 to swing between open and closed positions as illustrated in FIGS. 1 and 6. The hinge 108 may be spring-loaded to bias the access door 106 toward the extended end section 104 of the bottom portion 103 of the housing 101 when the access door 106 is in the closed position. For example, the hinge 108 may bias the access door 106 against the perimeter edges of the housing's side portions and the perimeter edge of the extended end section 104 of the housing's bottom portion 103.

Figure 5:
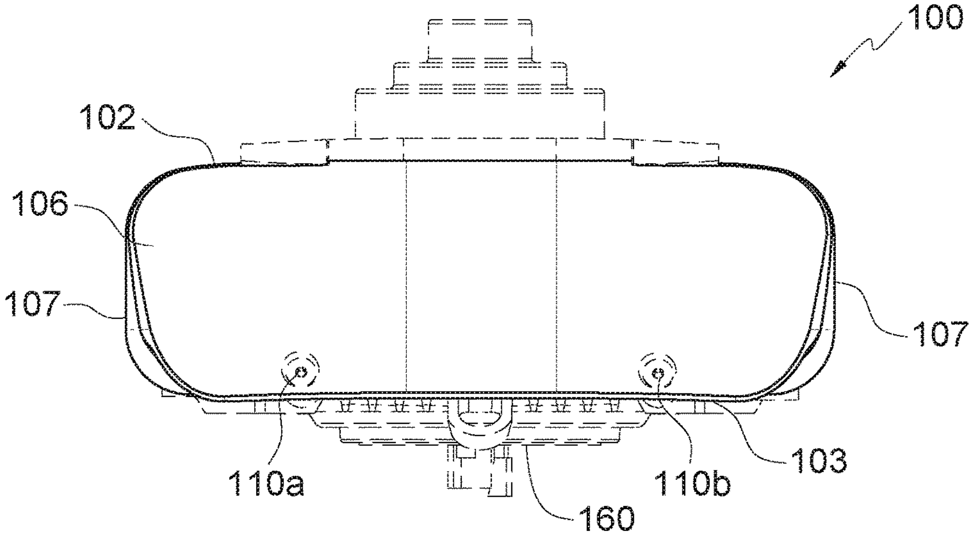
FIG. 5 illustrates a rear side view of the electronic apparatus of FIG. 1, illustrating an angled access door coupled to a top portion of the housing and in a closed position.

In other alternative embodiments, the access door 106 may define at least one aperture 110*a*, 110*b* (two shown for illustration purposes) and the extended end section 104 of the housing's bottom portion 103 may define at least one corresponding threaded aperture 111*a*, 111*b* (two also shown for illustration purposes) used for securing the access door 106 in the closed position to the extended end section 104 of the housing's bottom portion 103 using one or more screws 130 or other fasteners, as shown in exemplary form in FIGS. 5 and 6.

In further alternative embodiments, the housing's bottom portion 103 may define an aperture in or through which a powerline connector 160 is installed to enable the electronic apparatus 100 to receive electrical power from an external power source, such as a streetlight or a streetlight's lighting fixture or luminaire. In cases where the powerline connector 160 is compatible with a complementary powerline connector atop a streetlight lighting fixture, the electronic apparatus 100 may be streetlight-mountable. In such a case, the electronic apparatus 100 may be a streetlight-mountable wireless networking device, such as an access point, small cell node, repeater, light controller, artificial intelligence processor, power tap, or any other electronic apparatus.

In other alternative embodiments, the electrical connectors 126*a*-126*e* mounted within the housing cavity 140 may be camera connectors, Ethernet connectors (including Power over Ethernet (PoE, PoE+, PoE++) ports), fiber optic connectors, universal serial bus (USB) connectors, or other electrical connectors. Of course, other types of electrical connectors can be installed depending on the types of applications for which the electronic apparatus 100 is used.

In further alternative embodiments, an outdoor-mountable electronic apparatus 100 configured for moisture intrusion mitigation may include a housing 101 having a wall 125 providing access to electrical connectors 126*a*-126*e*, an upwardly tapered or curved extended end section 104 of a bottom portion 103 of the housing 101 forming an upwardly angled surface, an angled swinging access door 106 coupled to a top portion 102 of the housing 101 and covering a cavity 140 defined by the wall 125, the extended end section 104 of the housing's bottom portion 103, and side portions 107 of the housing 101 when in a closed position coextensive with the outwardly angled surface of the extended end section 104 of the housing's bottom portion 103, and at least one wire access port 122*a*-122*e* in the extended end section 104 of the housing's bottom portion 103 and configured to downwardly bias any cables 127 for coupling to the electrical connectors 126*a*-126*e*.

In some embodiments and with reference to FIGS. 1-7, a method (700) for servicing an outdoor-mountable electronic apparatus configured for moisture intrusion mitigation may be performed. According to one exemplary embodiment of such method, an installation or repair technician threads (704) each of one or more wires or cables through a respective cable access port defined in an upwardly curved end section of a bottom portion of the housing of the previously mounted or otherwise provided (702) electronic apparatus 100. If an access port is covered by a removable plug, the plug is removed (710) before commencing the cable or wire threading. During or after threading the wire(s) or cable(s) through the cable access port(s), an angled access door is opened (706), such as by raising, lifting, or sliding it. The access door covers a cavity formed by one or more side portions of the electronic apparatus' housing and the upwardly curved end section of the bottom portion of the electronic apparatus' housing. After opening the access door, a connector terminating each of the previously threaded wires or cables is coupled or connected to a respective electrical connector located within the cavity. After completing the cable connections, the access door is closed and optionally secured (708) to the upwardly curved end section of the bottom portion of the electronic apparatus' housing, such as through use of one or more fasteners.

Since the angled access door 106 is outwardly angled, water or moisture is going to drip off of the angled access door 106 (and away from the housing 101 and the electrical connector cavity 140), thereby mitigating the moisture entering the cavity 140. Further water intrusion mitigation is achieved by positioning the cable access ports 122*a*-122*e* in the extended end section 104 of the housing's bottom portion 103, especially where the electronic apparatus 100 is horizontally mounted, such as to a streetlight lighting fixture. As previously noted, the cable access ports 122*a*-122*e* may further include gaskets 112 to provide additional moisture or water intrusion mitigation.

During deployment, installation, servicing, or repair of the electronic apparatus 100 in the field, a technician can easily access the connectors 126*a*-126*e* within the cavity 140 by raising, lifting, or otherwise opening the angled access door 106. If the angled access door 106 is screwed shut, the technician may unscrew the screws 130 or otherwise remove any other fasteners securing the door 106 to quickly and easily access the electrical connectors 126*a*-126*e* and then simply close and re-secure the angled access door 106 after servicing. The disclosed configuration of the electronic apparatus 100 allows a camera 128 or other accessory and its corresponding connector-terminated cable 127 (e.g., for Ethernet connections, fiber optic connections, or other connection) to be easily connected to the electronic apparatus 100 without making the electronic apparatus 100 more susceptible to moisture or water intrusion. Once the technician is done making the appropriate connections, the technician can simply close the angled access door 106 and optionally secure it to the upwardly-oriented end section 104 of the bottom portion 104 of the electronic device's housing 101.

In some embodiments, the electronic apparatus 100 may also include a wireless transceiver module providing wireless communication capability to any one or more devices having corresponding wireless transceivers. In some cases, for example, using functionality provided by the wireless transceiver module, the electronic components embedded in the electronic apparatus 100 may implement a small cell device or a Wi-Fi access point or gateway. In this way, the electronic components permit one or more mobile devices to access the Internet. Municipalities or other entities may make Internet services available over a determined geographic area (e.g., a neighborhood, a city, an arena, a construction site, a campus, or the like) to remote mobile devices that are in proximity to any one of a plurality of a number of embodiments incorporating the electronic components making up the electronic apparatus 100. For example, if many streetlight fixtures in a neighborhood or city are equipped with a small cell device, such as small cell device 100, then Wi-Fi service can be provided to a large number of users. Further, based on seamless communication between a plurality of small cell device embodiments, the Wi-Fi service can be configured as a mesh that permits users to perceive constant internet connectivity even when the mobile device is in motion.

In other embodiments, the electronic apparatus 100 may be a wireless networking device that monitors one or more sensors or conditions associated with a corresponding streetlight fixture or other structure to which the apparatus 100 is mounted. Examples of sensed condition include, but are not limited to, light source failure (e.g., a burned out bulb), light pole tilt, external vibrations, light source temperature, external temperature, power usage, images, motion detection, sound recordings, network traffic, network throughput, cellular signal strength, ambient light level, or other information that can be obtained or recorded by the small cell device that makes up the electronic apparatus.

The electronic apparatus 100 can be part of a system or network of streetlight poles, streetlight fixtures, streetlight sources, or the like in a system level deployment controlled by a municipality or other government agency. In other cases, the system may be controlled by a private entity (e.g., private property owner, third-party service contractor, or the like). In still other cases, a plurality of entities may share control of the system of streetlight poles streetlight fixtures, streetlight sources, or the like.

In other embodiments, the electronic apparatus 100 may be equipped with communication capabilities, which allows for the monitoring or remote control of a light source of the streetlight fixture or of another utility device. Accordingly, each light source in each streetlight fixture or in a broader context each device in any fixture can be monitored and controlled remotely independently or in combination. In the case of a streetlight fixture, each streetlight fixture can be monitored and/or controlled as an independent light source or in combination with other light sources where the electronic apparatus can serve to provide the wireless (or wired) communication of light control signals and any other information (e.g., packetized data) between small cell devices.

As one non-limiting, non-exhaustive example, the electronic apparatus 100 may operate a small cell-networking device to provide wireless cellular-based network communication services.

While discussed above as being streetlight-mountable, the electronic apparatus 100 is not so limited and may be attached to any number of objects, including, but not limited to a light pole, an LED board, a bracket, a street sign, a highway sign, a bus stop shelter, an ATM, a phone booth, a building, an HVAC unit, a mailbox, a billboard, a light, a parking sign, a stop light, a speed limit sign, a solar cell, a crosswalk sign, a tunnel, a utility box, a water tower, a crane, a radio antenna tower, a store, an awning, a roof, or a parking pay station.

In the absence of any specific clarification related to its express use in a particular context, where the terms "substantial" or "about" in any grammatical form are used as modifiers in the present disclosure and any appended claims (e.g., to modify a structure, a dimension, a measurement, or some other characteristic), it is understood that the characteristic may vary by up to 30 percent. For example, a small cell networking device may be described as being mounted "substantially vertical." In these cases, a device that is mounted exactly vertical is mounted along a "Y" axis and a "X" axis that is normal (i.e., 90 degrees or at right angle) to a plane or line formed by a "Z" axis. Different from the exact precision of the term, "vertical," and the use of "substantially" or "about" to modify the characteristic permits a variance of the particular characteristic by up to 30 percent.

The terms "include" and "comprise" as well as derivatives thereof, in all of their syntactic contexts, are to be construed without limitation in an open, inclusive sense, (e.g., "including, but not limited to"). The term "or," is inclusive, meaning "and/or." The phrases "associated with" and "associated therewith," as well as derivatives thereof, can be understood as meaning to include, be included within, interconnect with, contain, be contained within, connect to or with, couple to or with, be communicable with, cooperate with, interleave, juxtapose, be proximate to, be bound to or with, have, have a property of, or the like.

Unless the context requires otherwise, throughout the specification and claims which follow, the word "comprise" and variations thereof, such as, "comprises" and "comprising," are to be construed in an open, inclusive sense (e.g., "including, but not limited to").

Reference throughout this specification to "one embodiment" or "an embodiment" or "some embodiments" and variations thereof mean that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content and context clearly dictates otherwise. It should also be noted that the conjunctive terms, "and" and "or" are generally employed in the broadest sense to include "and/or" unless the content and context clearly dictates inclusivity or exclusivity as the case may be. In addition, the composition of "and" and "or" when recited herein as "and/or" is intended to encompass an embodiment that includes all of the associated items or ideas and one or more other alternative embodiments that include fewer than all of the associated items or idea.

In the present disclosure, conjunctive lists make use of a comma, which may be known as an Oxford comma, a Harvard comma, a serial comma, or another like term. Such lists are intended to connect words, clauses or sentences such that the thing following the comma is also included in the list.

As the context may require in this disclosure, except as the context may dictate otherwise, the singular shall mean the plural and vice versa. All pronouns shall mean and include the person, entity, firm or corporation to which they relate. Also, the masculine shall mean the feminine and vice versa.

When so arranged as described herein, each computing device may be transformed from a generic and unspecific computing device to a combination device comprising hardware and software configured for a specific and particular purpose. When so arranged as described herein, to the extent that any of the inventive concepts described herein are found by a body of competent adjudication to be subsumed in an abstract idea, the ordered combination of elements and limitations are expressly presented to provide a requisite inventive concept by transforming the abstract idea into a tangible and concrete practical application of that abstract idea.

The various embodiments described above can be combined to provide further embodiments. Aspects of the embodiments can be modified, if necessary to employ concepts of the various patents, application and publications to provide further embodiments.

What is claimed is:

1. An outdoor-mountable electronic apparatus comprising:

a housing including a top portion, a bottom portion, one or more side portions interconnecting the top portion and the bottom portion, and an open-ended cavity at a first lengthwise end thereof, the bottom portion including an extended end section that extends past an end of the top portion at the first lengthwise end of the housing and is oriented upward toward a plane in which a flat, planar section of the top portion lies, the one or more side portions including extended end sections interconnecting the extended end section of the bottom portion to the top portion at the first lengthwise end of the housing, perimeter edges of the extended end sections of the one or more side portions being angled to account for differing lengths of the top portion and the bottom portion with the extended end section, the cavity being defined by at least the extended end section of the bottom portion and the extended end sections of the one or more side portions;

one or more electrical connectors mounted within the cavity; and an access door coupled to the top portion of the housing such that the access door opens upwardly, closes downwardly, and, when in a closed position, rests against at least the angled perimeter edges of the extended end sections of the one or more side portions of the housing, the access door being sized and shaped to cover the cavity when the access door is in the closed position.

2. The electronic apparatus of claim 1, wherein the access door is hinged at the top portion of the housing.

3. The electronic apparatus of claim 1, wherein the access door is pivotally coupled to the top portion of the housing.

4. The electronic apparatus of claim 1, further comprising:

a seal installed along perimeter edges of the top portion, the extended end sections of the one or more side portions, and the extended end section of the bottom portion of the housing to mitigate moisture intrusion when the access door is in the closed position.

5. The electronic apparatus of claim 1, wherein the extended end section of the bottom portion of the housing defines at least one cable access port for passage of at least one connector cable.

6. The electronic apparatus of claim 5, further comprising:

at least one removable plug for covering the at least one cable access port.

7. The electronic apparatus of claim 5, further comprising:

at least one gasket positioned within the at least one cable access port to mitigate intrusion of moisture through the at least one cable access port after the at least one connector cable has been passed through the at least one cable access port.

8. The electronic apparatus of claim 1, wherein the access door includes a spring-loaded hinge for biasing the access door toward the extended end section of the bottom portion of the housing when the access door is in the closed position.

9. The electronic apparatus of claim 1, wherein the access door defines at least one aperture and wherein the extended end section of the bottom portion of the housing defines at least one corresponding threaded aperture usable for securing the access door to the extended end section of the bottom portion of the housing using at least one fastener.

10. The electronic apparatus of claim 1, further comprising:

a wall interconnecting the top portion and the bottom portion of the housing, wherein the one or more electrical connectors are mounted to the wall.

11. The electronic apparatus of claim 1, further comprising:

a powerline connector mounted through an aperture defined by the bottom portion of the housing, the powerline connector being configured to receive electrical power from an external power source.

12. The electronic apparatus of claim 1, wherein the housing is configured to be horizontally mounted to a powerline connector atop a streetlight fixture.

13. The electronic apparatus of claim 1, wherein the extended end section of the bottom portion of the housing is curved upward.

14. A streetlight-mountable electronic apparatus comprising:

a housing including a top portion, a bottom portion, one or more side portions interconnecting the top portion and the bottom portion, and an open-ended cavity at a first lengthwise end thereof, the bottom portion including an extended end section that extends past an end of the top portion at the first lengthwise end of the housing and is oriented upward toward a plane in which a flat, planar section of the top portion lies, the one or more side portions including extended end sections interconnecting the extended end section of the bottom portion to the top portion at the first lengthwise end of the housing, perimeter edges of the extended end sections of the one or more side portions being angled to account for differing lengths of the top portion and the bottom portion with the extended end section, the cavity being defined by at least the extended end section of the bottom portion and the extended end sections of the one or more side portions;

one or more electrical connectors mounted within the cavity;

a powerline connector mounted through an aperture defined by the bottom portion of the housing, the powerline connector being configured to receive electrical power from a streetlight lighting fixture; and an access door coupled to the top portion of the housing such that the access door opens upwardly, closes downwardly, and, when in a closed position, rests against at least the angled perimeter edges of the extended end sections of the one or more side portions of the housing, the access door being sized and shaped to cover the cavity when the access door is in the closed position.

15. The electronic apparatus of claim 14, wherein the access door includes a spring-loaded hinge for biasing the access door toward the extended end section of the bottom portion of the housing when the access door is in the closed position.

16. The electronic apparatus of claim 14, further comprising:

a seal installed along edges of the top portion, the extended end sections of the one or more side portions, and the extended end section of the bottom portion of the housing to mitigate moisture intrusion when the access door is in the closed position.

17. The electronic apparatus of claim 14, wherein the extended end section of the bottom portion of the housing defines at least one cable access port for passage of at least one connector cable, the electronic apparatus further comprising:

at least one gasket positioned within the at least one cable access port to mitigate intrusion of moisture through the at least one cable access port after the at least one connector cable is passed through the at least one cable access port.

18. The electronic apparatus of claim 17, further comprising:

at least one removable plug for covering the at least one cable access port.

19. The electronic apparatus of claim 14, wherein the access door defines at least one aperture and wherein the extended end section of the bottom portion of the housing defines at least one corresponding threaded aperture usable for securing the access door to the extended end section of the bottom portion of the housing using at least one fastener.

20. A streetlight-mountable wireless networking device comprising:

a housing including a top portion, a bottom portion, one or more side portions interconnecting the top portion and the bottom portion, and an open-ended cavity at a first lengthwise end thereof, the bottom portion including an extended end section that extends past an end of the top portion at the first lengthwise end of the housing and is oriented upward toward a plane in which a flat, planar section of the top portion lies, the one or more side portions including extended end sections interconnecting the extended end section of the bottom portion to the top portion at the first lengthwise end of the housing, perimeter edges of the extended end sections of the one or more side portions being angled to account for differing lengths of the top portion and the bottom portion with the extended end section, the cavity being defined by at least the extended end section of the bottom portion and the extended end sections of the one or more side portions; and an access door coupled to the top portion of the housing such that the access door opens upwardly, closes downwardly, and, when in a closed position, rests against at least the angled perimeter edges of the extended end sections of the one or more side portions of the housing, the access door being sized and shaped to cover the cavity when the access door is in the closed position.

* * * * *